United States Patent
Howard

(10) Patent No.: US 11,644,297 B2
(45) Date of Patent: May 9, 2023

(54) THREE-DIMENSIONAL POSITION SENSOR SYSTEMS AND METHODS

(71) Applicant: TELEDYNE FLIR SURVEILLANCE, INC., Wilsonville, OR (US)

(72) Inventor: Andrew Howard, Portland, OR (US)

(73) Assignee: Teledyne FLIR Surveillance, Inc., Wilsonville, OR (US)

(*) Notice: Subject to any disclaimer, the term of this patent is extended or adjusted under 35 U.S.C. 154(b) by 10 days.

(21) Appl. No.: 17/476,064

(22) Filed: Sep. 15, 2021

(65) Prior Publication Data
US 2022/0090903 A1    Mar. 24, 2022

Related U.S. Application Data

(60) Provisional application No. 63/080,536, filed on Sep. 18, 2020.

(51) Int. Cl.
G01B 7/00     (2006.01)
G01R 33/02    (2006.01)

(52) U.S. Cl.
CPC .......... G01B 7/003 (2013.01); G01R 33/0206 (2013.01)

(58) Field of Classification Search
CPC combination set(s) only.
See application file for complete search history.

(56) References Cited

U.S. PATENT DOCUMENTS 6,690,159 B2   2/2004  Burreson et al.
9,459,087 B2   10/2016 Dunbar et al.
2007/0252586 A1* 11/2007 Arai .................. A61B 5/68
                                            324/207.13
2012/0249133 A1  10/2012 Friedrich
2014/0084906 A1  3/2014  Ruigrok et al.
(Continued)

FOREIGN PATENT DOCUMENTS

WO   WO 2006/101674   9/2006

OTHER PUBLICATIONS

Chen, Ke-Yu, et al., "Finexus: Tracking Precise Motions of Multiple Fingertips Using Magnetic Sensing", 2016, pp. 1504-1514, University of Washington and Oculus Research, San Jose, California.
(Continued)

Primary Examiner — Alvaro E Fortich
(74) Attorney, Agent, or Firm — Haynes and Boone, LLP

(57) ABSTRACT

Disclosed herein are systems and methods for a three-dimensional (3D) non-contact position sensor. A system includes a magnetic target coupled to and/or integrated with a target object and a position sensor comprising a plurality of magnetometers configured to provide a set of magnetic flux values corresponding to a magnetic field generated by the magnetic target. A logic device receives the set of magnetic flux values provided by the plurality of magnetometers of the position sensor and determines a position and/or orientation of the target object based, at least in part, on the received set of magnetic flux values. The position and/or orientation of the target object may be used as feedback to help position and/or orient the target object according to a desired position and/or orientation or to track its position accurately in real-time.

20 Claims, 5 Drawing Sheets

(56) References Cited

U.S. PATENT DOCUMENTS

| | | | |
|---|---|---|---|
| 2014/0257746 A1* | 9/2014 | Dunbar | G01B 7/003 |
| | | | 702/150 |
| 2014/0333310 A1 | 11/2014 | Lozinsky et al. | |
| 2015/0142376 A1* | 5/2015 | Ausserlechner | G01D 5/145 |
| | | | 702/151 |
| 2017/0239821 A1* | 8/2017 | Lessing | B25J 13/088 |
| 2017/0248445 A1 | 8/2017 | Ausserlechner | |
| 2017/0340309 A1* | 11/2017 | Ogasawara | A61B 8/0891 |
| 2018/0128648 A1 | 5/2018 | Schmitt | |

OTHER PUBLICATIONS

Raab, Frederick et. al., "Magnetic Position and Orientation Tracking System" Dec. 10, 1978, pp. 709-718, Polhemus Navigation Sciences Inc.

Chen, Ke-Yu et al., "uTrack: 3D Input Using Two Magnetic Sensors", 2013, pp. 237-244, University of Washington and Nokia, St. Andrews, UK.

* cited by examiner

THREE-DIMENSIONAL POSITION SENSOR SYSTEMS AND METHODS

CROSS-REFERENCE TO RELATED APPLICATIONS

This U.S. Patent application claims priority to and the benefit of U.S. Provisional Application No. 63/080,536 filed Sep. 18, 2020, entitled "THREE-DIMENSIONAL POSITION SENSOR SYSTEMS AND METHODS", which is incorporated herein by reference in its entirety.

TECHNICAL FIELD

One or more embodiments of the invention relate generally to three-dimensional (3D) position sensors and more particularly, for example, to a 3D position sensor using an array of magnetometers.

BACKGROUND

In many mechanical systems, it is important to know the position and/or attitude of one part or object relative to another. In some applications, position sensor accuracy has a direct impact on the performance of a system or device, such as actuators, control devices, manufacturing machines, aircraft lifting surfaces, and the like. Some applications call for the location of a mechanical part in all three Cartesian axes (x, y, and z), which can require a multitude of sensors. Including additional sensors in a product can result in undesirable characteristics, such as increased cost, onerous packaging constraints, and increased overall complexity. In some applications, it may be required to sense the relative position between two components without bringing them into contact with each other, which can be difficult to accomplish with current techniques.

Therefore, there is a need in the art for systems and methods for a three-dimensional sensor that addresses the deficiencies noted above, other deficiencies known in the industry, or at least offers an alternative to current techniques. For example, improvements are needed to accurately sense a location of a component or object in x, y, and z coordinates without contact.

SUMMARY

Techniques are disclosed for systems and methods for a three-dimensional (3D) position sensor. In accordance with one or more embodiments, a 3D position sensor system may include a magnetic target coupled to and/or integrated with a target object, a position sensor comprising a plurality of magnetometers configured to provide a set of magnetic flux values corresponding to a magnetic field generated by the magnetic target, and a logic device configured to communicate with the position sensor. The logic device may be configured to receive the set of magnetic flux values provided by the plurality of magnetometers of the position sensor and to determine a position and/or orientation of the target object based, at least in part, on the received set of magnetic flux values.

In another embodiment, a position sensor includes a plurality of magnetometers configured to provide a set of magnetic flux values corresponding to a magnetic field generated by a magnetic target physically separated from the position sensor. The plurality of magnetometers may include first, second, and third magnetometers configured to detect respective first, second, and third magnetic flux values corresponding to the magnetic field generated by the magnetic target. The position sensor may also include a circuit board, where the plurality of magnetometers are disposed along the circuit board in a coplanar and noncolinear fashion. The first magnetometer may be configured to detect the first magnetic flux value along a first axis of the position sensor, the second magnetometer may be configured to detect the second magnetic flux value along a second axis of the position sensor, and the third magnetometer may be configured to detect the third magnetic flux value along a third axis of the position sensor. The first, second, and third axes may be parallel to each other, for example, or may be orthogonal to each other, depending on the application.

In another embodiments, a method includes receiving magnetometer data from one or more position sensors, where the magnetometer data comprises magnetic flux values corresponding to a magnetic field generated by one or more magnetic targets coupled to and/or integrated with a target object and physically separated from the respective one or more position sensors; and determining a position and/or orientation of each of the one or more magnetic targets and/or the target object based, at least in part, on the received magnetometer data.

The scope of the invention is defined by the claims, which are incorporated into this section by reference. A more complete understanding of embodiments of the invention will be afforded to those skilled in the art, as well as a realization of additional advantages thereof, by a consideration of the following detailed description of one or more embodiments. Reference will be made to the appended sheets of drawings that will first be described briefly.

BRIEF DESCRIPTION OF THE DRAWINGS

Embodiments of the invention and their advantages are best understood by referring to the detailed description that follows. It should be appreciated that like reference numerals are used to identify like elements illustrated in one or more of the figures.

DETAILED DESCRIPTION

In accordance with various embodiments of the present disclosure, described herein are systems configured to sense or otherwise determine a position and/or orientation (e.g., a set of relative and/or absolute X, Y, and Z Cartesian coordinates and/or Euler angle coordinates) of a target object, part, or device with respect to a position sensor. The system requires no contact between the position sensor and a sensed portion of the target object, such as a magnet mounted to the target object. One or more position sensors may be used individually or together to determine the position and/or other motion characteristics of the target object accurately, such as relative or absolute and/or angular displacements and/or motion. For example, one or more position sensors may be used to determine a position of the target object in one or more degrees of freedom, such as two or more, three or more, or six degrees of freedom (6DOF), including any combination of Cartesian and/or angular coordinate systems (e.g., cylindrical, polar, spherical, and/or other coordinate systems) to suit a particular application and/or system motion constraints.

Each position sensor may include a plurality of magnetometers, such as a set of three or more single-axis magnetometers on a single circuit board, configured to detect magnetic flux values at their respective locations created by a respective magnet (e.g., a permanent magnet) coupled to and/or integrated with the target object. For example, the system may include a plurality of position sensors configured to detect a set of magnetic flux values of the magnetic field generated by respective magnets (e.g., a first position sensor configured to detect the magnetic field of a first magnet, a second position sensor configured to detect the magnetic field of a second magnet, and so on). In various embodiments, the system may be calibrated in situ to account for intrinsic errors, distortions, and sensor positioning. For example, the target object may be motioned to known positions while magnetic flux values and their associated X, Y, and Z Cartesian coordinate positions of each position sensor are recorded and stored in a database, creating a calibration map or table between magnetic flux values and positions and/or orientations, as described herein.

Figure 1A:
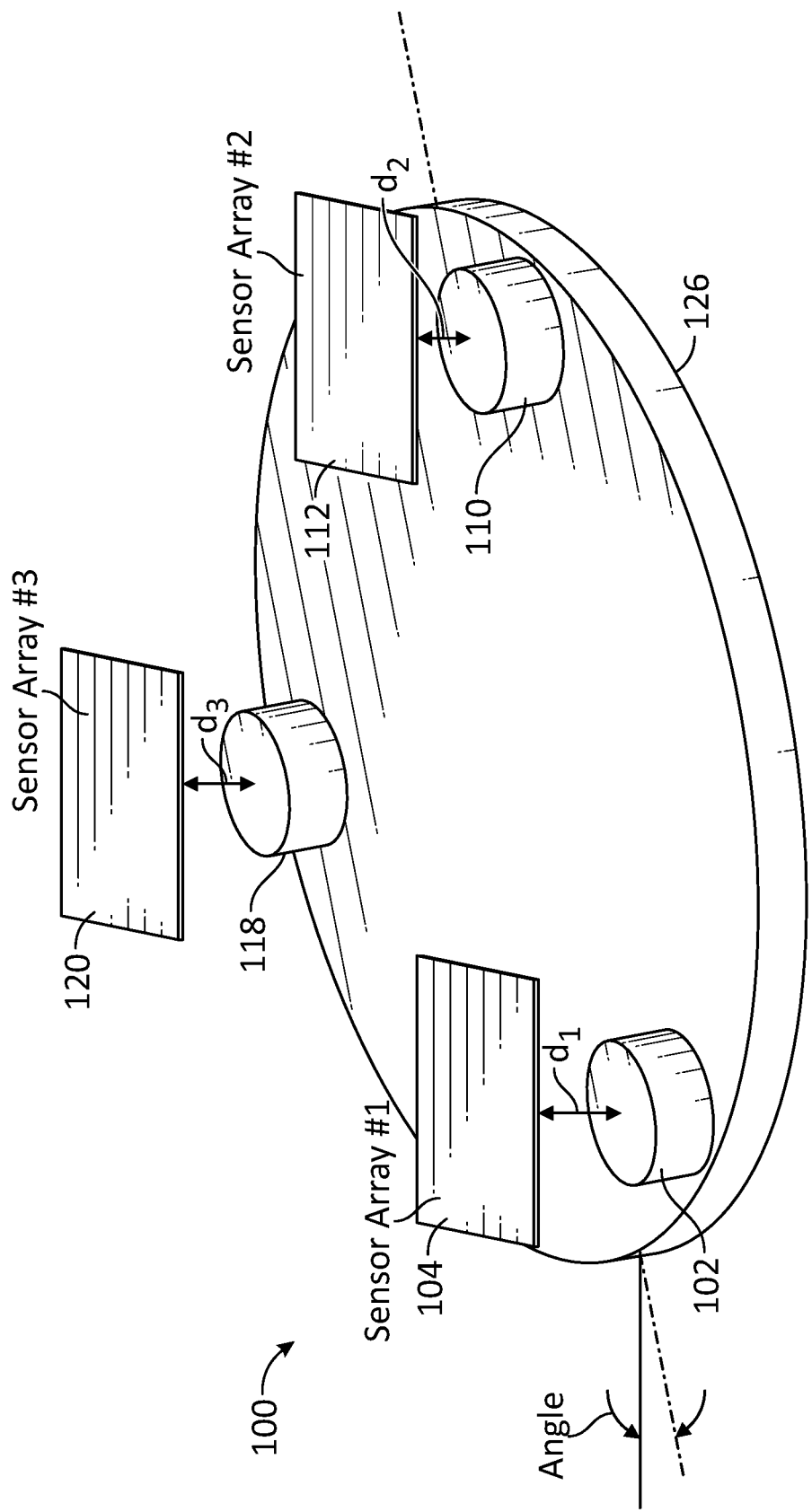
FIG. 1A is an illustration of a system configured to sense a component's location in accordance with an embodiment of the disclosure.

FIG. 1A is an illustration of a system 100 configured to sense a component's location in accordance with an embodiment of the disclosure. As described herein, system 100 may be configured to accurately track an object in three or more degrees of freedom, such as a part of a mechanical system. As one example, system 100 may be configured to accurately track a gimbal payload in three or more degrees of freedom, but it is understood that the disclosure is not limited to gimbal applications as system 100 could be applied to track any mechanical part.

In one or more embodiments, system 100 may be configured to sense or determine the relative or absolute position (e.g., the X, Y, and Z Cartesian coordinates) and/or orientation of an object with respect to one or more position sensors. System 100 requires no contact between the position sensor(s) and a magnetic target, such as a magnet mounted to a mechanical device. Such configurations can be useful for any technological application where accurate position sensing between two non-contacting parts is critical. Depending on the application, one or more position sensors can be used together to accurately determine an object's position in all six degrees of freedom. For example, multiple position sensors can be used together to determine angular motion and/or absolute displacements of an object, such as along one or more linear axes and/or along one or more angular axes. The embodiments described herein may also allow for accurate position tracking in compact setups subjected to harsh environmental conditions including temperature and pressure changes, contamination, and vibration, among other conditions.

Referring to FIG. 1A, system 100 may include one or more position sensors configured to sense, acquire, monitor, or otherwise determine a position of one or more magnetic targets and/or target objects. The magnetic target may be a target object itself or portions of a target object. In some embodiments, the magnetic targets may be implemented as one or more magnets associated with a target object. For example, system 100 may include a first magnetic target 102 and a first position sensor 104 configured to determine a first position of first magnetic target 102. In some embodiments, system 100 may include a second magnetic target 110 and a second position sensor 112 configured to determine a second position of second magnetic target 110. System 100 may also include a third magnetic target 118 and a third position sensor 120 configured to determine a third position of third magnetic target 118.

In some embodiments, system 100 may include a target object 126 including one or more of first magnetic target 102, second magnetic target 110, and third magnetic target 118. For example, first magnetic target 102, second magnetic target 110, and third magnetic target 118, or any combination thereof, may be attached to, defined in, disposed in, or otherwise associated with target object 126. Target object 126 may be any mechanical part of which accurate position determination is desired. For example, target object 126 may be a tilting stage, a gimbal, or other mechanical part. First magnetic target 102, second magnetic target 110, and/or third magnetic target 118 may implemented by a temporary magnet, a permanent magnet, or an electromagnet, for example, or any other type of magnet or magnetic material or combination of magnetic materials capable of generating a magnetic field measurable by position sensors of system 100.

As described herein, first position sensor 104 may be configured to determine a first displacement $d_1$ of target object 126. Similarly, second position sensor 112 may be configured to determine a second displacement $d_2$ of target object 126, and third position sensor 120 may be configured to determine a third displacement $d_3$ of target object 126, as detailed more fully below. The first displacement $d_1$ may be a distance from first position sensor 104 to target object 126 (e.g., to first magnetic target 102), a displacement distance of first magnetic target 102 along one or more axes, or the like. Similarly, the second displacement $d_2$ may be a distance from second position sensor 112 to target object 126 (e.g., to second magnetic target 110), a displacement distance of second magnetic target 110 along one or more axes, or the like. The third displacement $d_3$ may be a distance from third position sensor 120 to target object 126 (e.g., to third magnetic target 118), a displacement distance of third magnet 120 along one or more axes, or the like.

As described herein, each position sensor may be configured to measure or detect a magnetic flux of a magnetic field at its location that is created by an associated magnet. For example, first position sensor 104 may be configured to detect one or more first magnetic flux values (e.g., a first set of magnetic flux values) of the magnetic field generated by first magnetic target 102. Similarly, second position sensor 112 may be configured to detect one or more second magnetic flux values (e.g., a second set of magnetic flux values) of the magnetic field generated by second magnetic target 110, and third position sensor 120 may be configured to detect a one or more third magnetic flux values (e.g., a third set of magnetic flux values) of the magnetic field generated by third magnetic target 118. In some embodiments, each position sensor may be configured to detect magnetic flux values of a magnetic field generated by target object 126 (e.g., by first magnetic target 102, second magnetic target 110, third magnetic target 118, or any combination thereof).

The linear and/or angular displacement of target object 126 may be determined based on the detected magnetic flux values. For example, by analyzing the magnetic flux values (e.g., by comparing the relative strength of the magnetic field, etc.) detected by each position sensor, the absolute or relative displacements and/or angular motion of target object 126 can be determined. For instance, an incline angle of target object 126 can be determined by calculating the relative difference between the first displacement $d_1$ and the second displacement $d_2$ to target object 126. The detected magnetic flux values may also be used to determine an x-translation, a y-translation, and/or a z-translation of target object 126 (or portions of target object 126). If three position sensors are used together, the location of target object 126 can be fully determined in all six degrees of freedom by analyzing the first displacement $d_1$, second displacement $d_2$, and the third displacement $d_3$. Based on the first displacement $d_1$, second displacement $d_2$, and the third displacement $d_3$, a tip and/or tilt of target object 126 may be determined, as well as overall xyz-translations of target object 126. Based on the xy-translations of target object 126, a twist or rotation of target object 126 may be determined.

The absolute position and/or orientation of target object 126 may be determined based, at least in part, on the absolute position and/or orientation of the one or more position sensors. For example, knowing the origin or absolute position of each position sensor, the relative positions between the positions sensors and their associated magnetic targets may be used to determine the absolute position of target object 126. In some embodiments, determining the absolute position and/or orientation of target object 126 may require knowing or determining the coordinate frame transform (calibration) between the position and/or orientation of the magnetic target(s) and the position and/or orientation of target object 126. In some embodiments, data related to the relative positions between the position sensors and their associated magnetic targets may be sent to a logic device (e.g., an inertial measurement unit, etc.) for determining the relative and/or absolute position of target object 126.

Figure 1B:
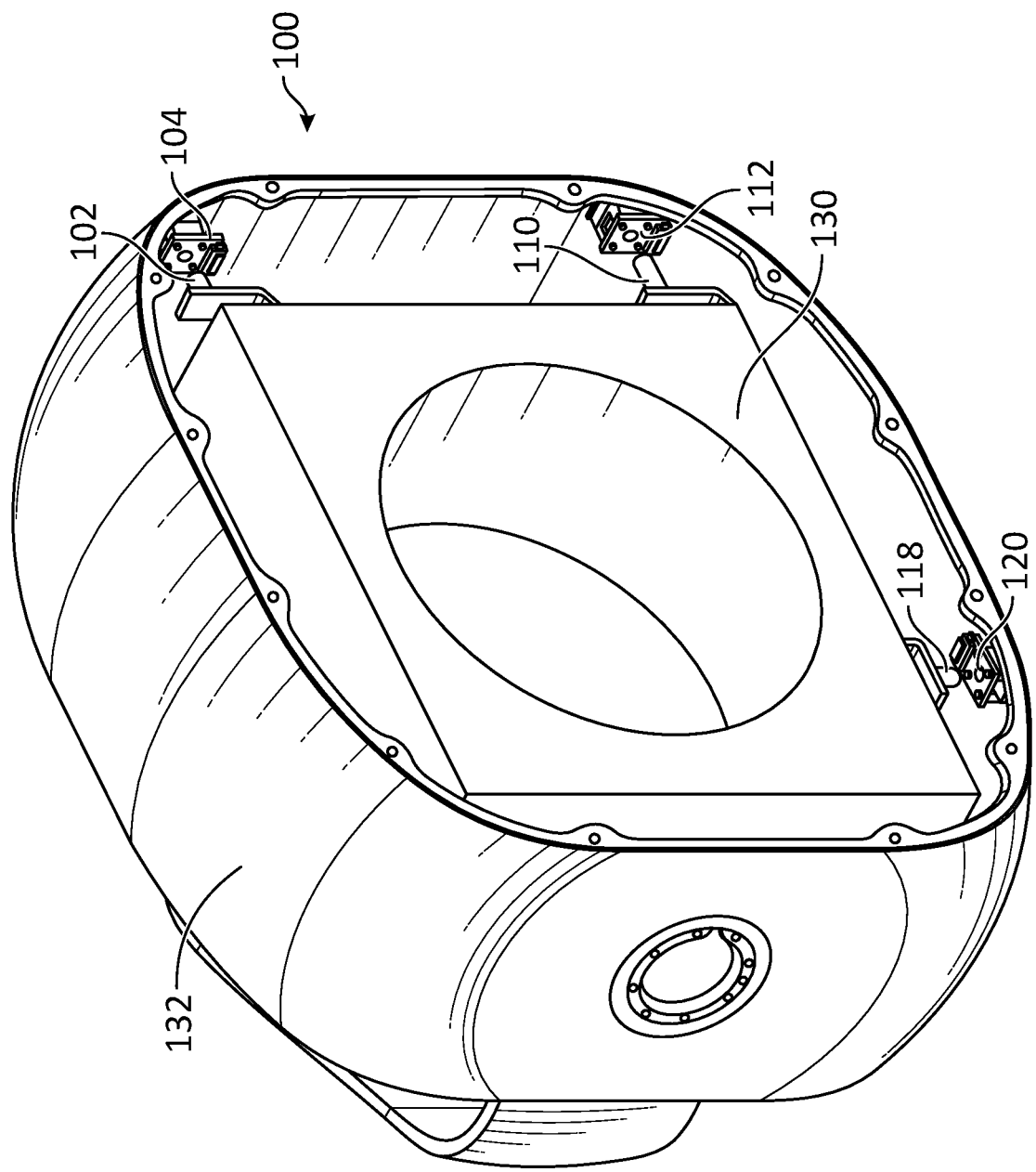
FIG. 1B is an illustration of a system configured to sense a component's location in accordance with an embodiment of the disclosure.

FIG. 1A is illustrative only, and system 100 may include other configurations. For example, FIG. 1B illustrates another configuration of system 100. As shown in FIG. 1B, system 100 may be embodied in gimbal applications. For example, first position sensor 104, second position sensor 112, and third position sensor 120 may be used to precisely track or determine the position and/or orientation of a payload 130 coupled to/within a gimbal 132 without contacting payload 130. In various embodiments, gimbal 132 may be coupled to a mobile structure (e.g., a terrestrial vehicle, a watercraft, or an aircraft), for example, or may be coupled to a stationary structure (e.g., a building, a monitoring post, or a natural feature such as a tree or outcropping).

As shown, first position sensor 104, second position sensor 112, and third position sensor 120 may be coupled to gimbal 132, such as to a housing of gimbal 132. First magnetic target 102, second magnetic target 110, and third magnetic target 118 may be coupled to payload 130, such as via respective brackets attached to payload 130. As shown, first magnetic target 102, second magnetic target 110, and third magnetic target 118 may be attached along the periphery of payload 130, although other configurations are contemplated. First position sensor 104 and second position sensor 112 may be arranged along one side of payload 130, with third position sensor 120 arranged along another side of payload 130. In some embodiments, first position sensor 104, second position sensor 112, and third position sensor 120 may be arranged along different sides of payload 130.

First position sensor 104 tracks the position of first magnetic target 102 as payload 130 moves within gimbal 132. Similarly, second position sensor 112 may track the position of second magnetic target 110, and third position sensor 120 may track the position of third magnetic target 118, as payload 130 moves within gimbal 132. For example, first position sensor 104, second position sensor 112, and third position sensor 120, or any combination thereof, may accurately determine the translation or rotation of payload 130 within gimbal 132. In some embodiments, gimbal 132 may include one or more sensors configured to track the position of payload 130. In such embodiments, the gimbal sensors may determine or provide a coarse position of payload 130, with system 100 (e.g., first position sensor 104, second position sensor 112, and third position sensor 120) determining or providing a fine position of payload 130 within gimbal 132.

In some embodiments, system 100 may be implemented with a single position sensor 104 including a plurality of magnetometers configured to provide magnetic flux values/magnetometer data corresponding to positions and/or orientations of magnetic target 102, and system 100 may be configured to determine the position and/or orientation of payload 130 based solely on the magnetometer data from the single position sensor 104. For example, in some embodiments, the motion of payload 130 may be constrained (e.g., by gimbal 132) such that the relative x-y position of magnetic target 102 (e.g., a two-dimensional relative position to position sensor 104) may be sufficient to determine the position and/or orientation of payload 130. In other embodiments, magnetic target 102 may be configured to generate a magnetic field with sufficient asymmetry and gradient such that magnetometer data provided by single position sensor 104 (e.g., including three planar/noncolinear magnetometers configured to measure magnetic flux along parallel axes) is sufficient to determine the position and orientation of magnetic target 102, which may then be used to determine the position and orientation of payload 130. In related embodiments, a known mounting and/or integration relationship between the positions and/or orientations of magnetic target 102 and payload 130, a known constrained range of motion of payload 130, and/or combinations of these may be used to determine the position and orientation of payload 130, as described herein. In various embodiments, similar configurations of the magnetic fields generated by magnetic targets may be used to increase the sensitivity of position sensor 104, increase the range of position sensor 104, simplify the positioning and/or orienting of magnetometers within position sensor 104, and/or reduce magnetic interference between such magnetic targets and payload 130 and/or gimbal 132.

Figure 2:
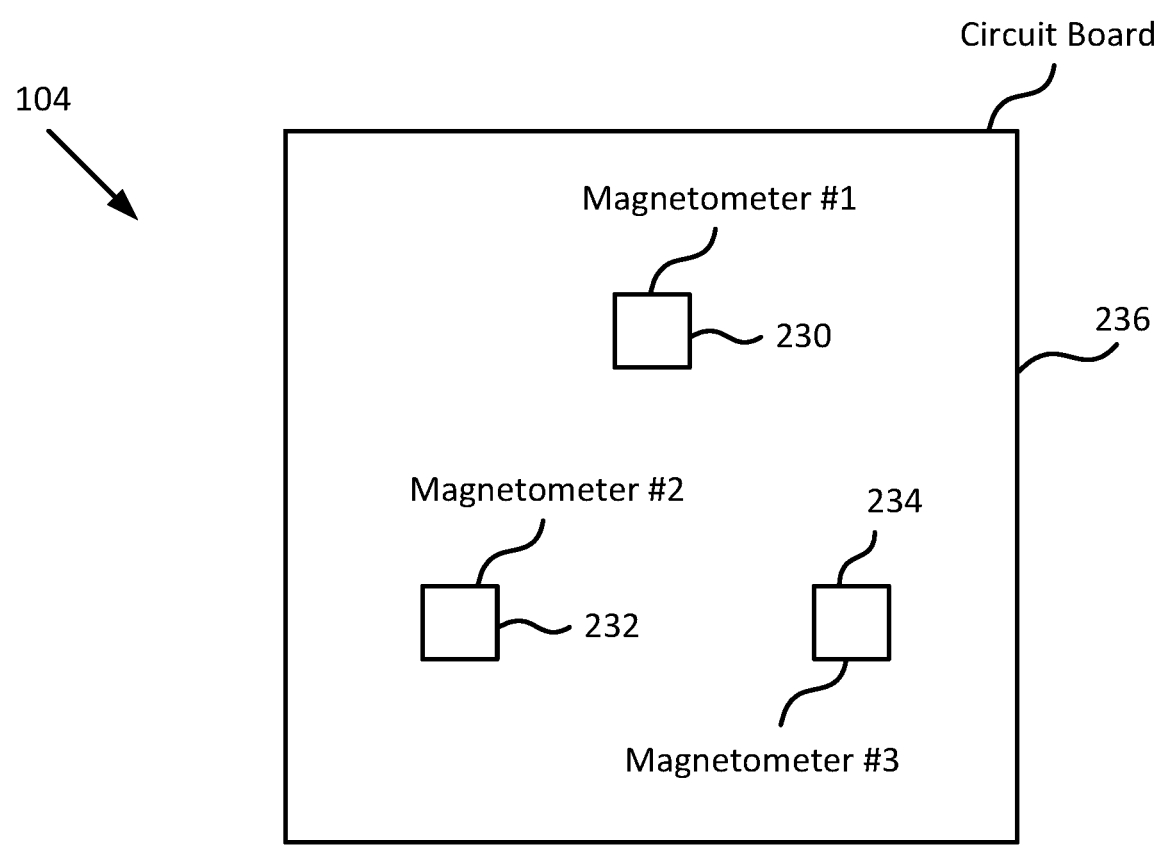
FIG. 2 is an illustration of a position sensor in accordance with an embodiment of the disclosure.

FIG. 2 is an illustration of a position sensor (e.g., any one of first position sensor 104, second position sensor 112, or third position sensor 120) in accordance with an embodiment of the disclosure. Although FIG. 2 illustrates first position sensor 104, second position sensor 112 and third position sensor 120 may include a similar configuration. Referring to FIG. 2, first position sensor 104 may include a first plurality of magnetometers each configured to detect the magnetic field at its location. For example, first position sensor 104 may include three single-axis magnetometers, each configured to detect magnetic flux values of the magnetic field generated by first magnetic target 102 along respective axes, which may be orthogonal to one another. As shown in FIG. 2, first position sensor 104 includes a first magnetometer 230, a second magnetometer 232, and a third magnetometer 234. First magnetometer 230 may be configured to detect a first magnetic flux value of the magnetic field generated by first magnetic target 102 along a first axis, such as along one of the X, Y, and Z Cartesian axes. Similarly, second magnetometer 232 may be configured to detect a second magnetic flux value of the magnetic field generated by first magnetic target 102 along a second axis, such as along another of the X, Y, and Z Cartesian axes. Third magnetometer 234 may be configured to detect a third magnetic flux value of the magnetic field generated by first magnetic target 102 along a third axis, such as along the last remaining of the X, Y, and Z Cartesian axes. In some embodiments, all three magnetometers 230, 232, 234 may be configured to provide magnetic flux values of the magnetic field as measured along three axes that are parallel but spaced from each other so as to be coplanar but not colinear, similar to the arrangement shown in FIG. 2. Although single-axis magnetometers are described, in some embodiments, one or more of magnetometers 230, 232, 234 may be a multi-axis magnetometer configured to measure magnetic flux values along a plurality of axes.

With continued reference to FIG. 2, first, second, and third magnetometers 230, 232, 234 may be connected to or otherwise associated with a first circuit board 236, which may be printed. The exact spacing and pattern of the resulting magnetometer array of first, second, and third magnetometers 230, 232, 234 can be chosen by a designer, although some arrangements may provide better resolution than others due to nonlinearities of the field produced by first magnetic target 102. For example, first, second, and third magnetometers 230, 232, 234 can be placed anywhere on first circuit board 236. First, second, and third magnetometers 230, 232, 234 may be spaced sufficiently to measure a gradient of the magnetic field generated by first magnetic target 102. In some embodiments, first, second, and third magnetometers 230, 232, 234 can be oriented similarly or differently from one another. In some embodiments, first, second, and third magnetometers 230, 232, 234 may be coplanar and colinear. In some embodiments, first, second, and third magnetometers 230, 232, 234 may be coplanar but not colinear (i.e., non-colinear). First, second, and third magnetometers 230, 232, 234 may be oriented along the X, Y, and Z Cartesian axes. In some embodiments, first, second, and third magnetometers 230, 232, 234 may include parallel measurement axes. For example, first, second, and third magnetometers 230, 232, 234 may be oriented such that their sensors are coplanar and aimed in a single direction based on the magnetic field generated by first magnetic target 102. For example, first, second, and third magnetometers 230, 232, 234 may be oriented such that their sensors are aimed in the Z direction away from first circuit board 236, in the X direction along first circuit board 236, in the Y direction along first circuit board 236, or the like.

Such examples are illustrative only, and first, second, and third magnetometers 230, 232, 234 may be positioned, spaced, arranged, or oriented in any manner allowing the magnetometers to sense the magnetic field (e.g., and corresponding magnetic field gradients) produced by first magnetic target 102. For instance, first, second, and third magnetometers 230, 232, 234 may be positioned along first circuit board 236 based on the size of first magnetic target 102 and its magnetic field strength and/or shape. For example, the displacements between first, second, and third magnetometers 230, 232, 234 may be increased or decreased based on the size of the magnetic target and/or the strength and/or the shape of the magnetic field generated by the magnetic target.

The shape, strength, and location of first magnetic target 102 can also be left to the designer, depending on the requirements for resolution and accuracy. In some embodiments, first magnetic target 102 may include a shape or configuration that produces an asymmetric magnetic field. Knowing the shape or configuration of first magnetic target 102 and the asymmetric magnetic field, the magnetic flux detected by first position sensor 104 may indicate a relative orientation of first magnetic target 102. As a result, the position of target object 126 can be determined. In some embodiments, the position of target object 126 can be fully determined in all six degrees of freedom using a single position sensor and one magnetic target.

Second position sensor 112 and third position sensor 120 may include a similar configuration. For example, second position sensor 112 may include a second plurality of magnetometers configured to detect a second set of magnetic flux values of a second magnetic field generated by second magnetic target 110. For example, second position sensor 112 may include three single-axis magnetometers, each configured to detect magnetic flux values of the second magnetic field generated by second magnetic target 110 along respective axes. Second position sensor 112 may include a fourth magnetometer, a fifth magnetometer, and a sixth magnetometer, similar to first magnetometer 230, second magnetometer 232, and third magnetometer 234, respectively. The fourth magnetometer may be configured to detect a fourth magnetic flux value of the second magnetic field generated by second magnetic target 110 (e.g., along the first axis). Similarly, the fifth magnetometer may be configured to detect a fifth magnetic flux value of the second magnetic field generated by second magnetic target 110 (e.g., along the second axis). The sixth magnetometer may be configured to detect a sixth magnetic flux value of the second magnetic field generated by second magnetic target 110 (e.g., along the third axis). Second position sensor 112 may also include a second circuit board, similar to first circuit board 236, with the second plurality of magnetometers connected to the second circuit board.

Like first position sensor 104 and second position sensor 112, third position sensor 120 may include a third plurality of magnetometers configured to detect a third set of magnetic flux values of a third magnetic field generated by third magnetic target 118. For example, third position sensor 120 may include three single-axis magnetometers, each configured to detect magnetic flux values of the third magnetic field generated by third magnetic target 118 along respective axes. Third position sensor 120 may also include a third circuit board, similar to first circuit board 236, with the third plurality of magnetometers connected to the third circuit board.

The one or more position sensors may be calibrated to provide accurate tracking of target object 126. Calibration of the position sensors may be accomplished in many ways. For example, target object 126 may be motioned to known positions while magnetic flux values from each of the position sensors are recorded and stored in a database. Such an in-system calibration of recording and storing magnetic flux values and their associated X, Y, and Z positions creates a calibration table or map between magnetic flux and position (e.g., two-dimensional position, three-dimensional position, etc.). The number of data points needed to create the calibration table or map may vary depending on a desired resolution or accuracy. In some embodiments, a representative calibration may be performed out-of-system before mounting the magnet and position sensor pairs within the product. In variable temperature environments, multiple calibrations may be performed at different temperatures to determine one or more thermal characteristics of system 100.

An in-system calibration may provide many advantages. For example, bias and scale factor errors intrinsic to each position sensor may be inherently incorporated into the calibration table or map. In addition, static localized magnetic distortions, which can be very difficult to model, are accounted for directly during calibration. The user can also determine how fine the calibration table or map needs to be to meet sensing requirements. Through in-system calibration, the placement of the magnetometers on each position sensor relative to one another does not need to be done precisely. In addition, no mathematical formulations for the magnetic field are required. These and other characteristics underscore the flexibility of in-system calibration.

Figure 3:
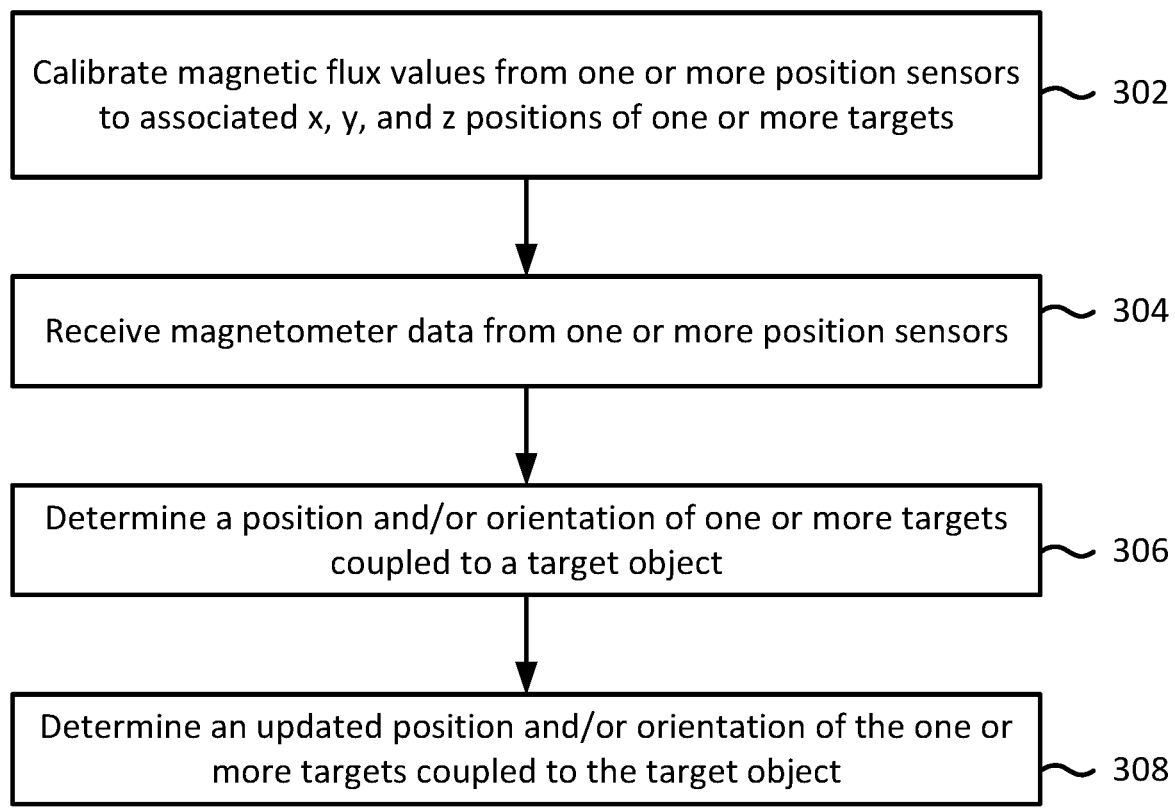
FIG. 3 is a flowchart of a method of detecting a component's location in accordance with an embodiment of the disclosure.

FIG. 3 is a flowchart of a process 300 of detecting a component's location, such as the location of target object 126, in accordance with an embodiment of the disclosure. Any step, sub-step, sub-process, or block of process 300 may be performed in an order or arrangement different from the embodiments illustrated in FIG. 3. For example, one or more blocks may be omitted from or added to process 300. Although process 300 is described with reference to the embodiments of FIGS. 1-2, process 300 may be applied to other embodiments.

In block 302, process 300 may include calibrating magnetic flux values from one or more position sensors to associated X, Y, and Z positions of one or more magnetic targets. For example, block 302 may include calibrating magnetic flux values from a first position sensor to associated X, Y, and Z positions of a first magnetic target. Block 302 may include calibrating magnetic flux values from a second position sensor to associated X, Y, and Z positions of a second magnetic target. In some embodiments, Block 302 may include calibrating magnetic flux values from a third position sensor to associated X, Y, and Z positions of a third magnetic target. Block 302 may include motioning a target object to known positions while magnetic flux values from one or more position sensors (e.g., any combination of the first position sensor, the second position sensor, and the third position sensor) are recorded and stored in a database. In various embodiments, such database may be implemented as a calibration table or map between magnetic flux values and positions/orientations of magnetic targets and/or a corresponding target object.

In block 304, process 300 includes receiving magnetometer data from one or more position sensors. For example, block 304 may include receiving real-time flux data sampled at a plurality of (e.g., three) displaced positions. In some embodiments, Block 304 may include monitoring, using the first position sensor, magnetic flux values of a first magnetic field generated by the first magnet. For example, updated magnetometer data may be received from the first position sensor. The first position sensor may include three single-axis magnetometers, each configured to detect magnetic flux values of the magnetic field generated by the first magnet along respective axes, such as along the X, Y, and Z Cartesian axes.

In some embodiments, block 304 may include monitoring, using the second position sensor, second magnetic flux values of a second magnetic field generated by the second magnet. Monitoring the second magnetic flux values may include receiving updated magnetometer data from the second position sensor. The second position sensor may include three single-axis magnetometers, each configured to detect magnetic flux values of the second magnetic field generated by the second magnet along respective axes, such as along the X, Y, and Z Cartesian axes. In some embodiments, block 304 may include monitoring, using a third position sensor, third magnetic flux values of a third magnetic field generated by the third magnet. Monitoring the third magnetic flux values may include receiving updated magnetometer data from the third position sensor. The third position sensor may include three single-axis magnetometers, each configured to detect magnetic flux values of the third magnetic field generated by the third magnet along respective axes, such as along the X, Y, and Z Cartesian axes.

In block 306, process 300 includes determining a position and/or orientation (either relative or absolute) of one or more magnetic targets coupled to a target object. The position and/or orientation of the one or more magnetic targets may be based on the magnetometer data received from the one or more position sensors. For example, the position and/or orientation of a magnetic target may be determined based, at least in part, on magnetometer data provided by a sensor array (e.g., of a single position sensor, defined by a plurality of position sensors, etc.). The position and/or orientation of the target object can then be determined based, at least in part, on the position and/or orientation of the magnetic target(s).

In some embodiment, the position and/or orientation of the one or more magnetic targets may be determined using the calibration table or map by comparing the monitored magnetic flux values associated with known positions of the one or more magnetic targets or the target object. In some embodiments, block 306 may include determining a first position of the first magnet based on the monitored first magnetic flux values. Block 306 may include determining a second position of the second magnet based on the monitored second magnetic flux values. In some embodiments, block 306 may include determining a third position of the third magnet based on the monitored third magnetic flux values.

In some embodiments, block 306 may include determining an angular position of the target object. The angular position of the target object may be based on the monitored magnetic flux values of the first magnet, the second magnet, and/or the third magnet. For instance, an incline angle of the target object can be determined by calculating the relative difference between two distances to the target object. In some embodiments, the position of the target object can be fully determined in all six degrees of freedom (three linear degrees of freedom and three angular degrees of freedom).

In block 308, process 300 may include determining an updated position and/or orientation (either relative or absolute) of the one or more magnetic targets coupled to the target object. The updated position and/or orientation may be determined based on updated magnetic flux values. For example, the updated position and/or orientation of the target object may be based on updated magnetometer data received from one or more position sensors, such as via reference to the calibration table or map. As a result, the position and/or orientation of the target object may be tracked over time, such as in real-time or near real-time.

In block 308, process 300 may include determining both a linear displacement and an angular displacement of the target object. For example, a combination of positions of the one or more magnetic targets may be used to determine the position and orientation of the target object. The linear and angular displacements may be determined based on the monitored magnetic flux values of the magnetic field(s) generated by the first magnet, the second magnet, and the third magnet, or any combination thereof. For example, linear displacements of the target object along the X, Y, and Z Cartesian axes, as well as rotation of the target object about the X, Y, and Z Cartesian axes, may be determined based on a comparison between the magnetometer data and the updated magnetometer data.

In some embodiments, magnetic flux data may be mapped to linear and/or angular positions using a machine learning approach. For example, any suitable calibration procedure may be used to linearize the transformation between magnetic flux values and position. Examples include lookup tables, custom functions to correct nonlinearities, and elimination of bias and scale factor errors. In some embodiments, machine learning (e.g., supervised deep learning, neural networks, self-taught algorithms, etc.) may be utilized to map magnetic flux values to position.

Figure 4:
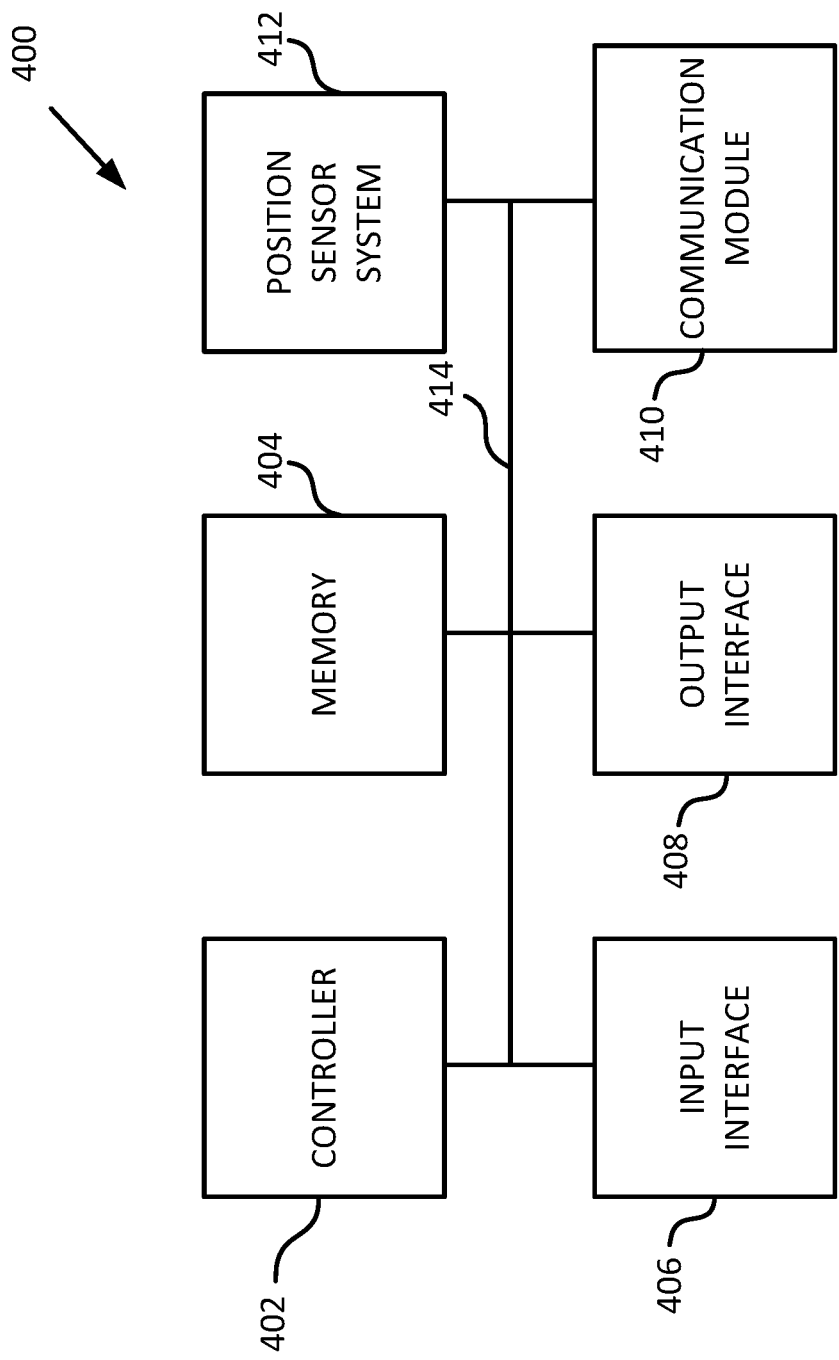
FIG. 4 is a block diagram illustrating an example computing or processing system in accordance with an embodiment of the disclosure.

FIG. 4 is a block diagram illustrating an example of a computing or processing system 400 in which embodiments of the present disclosure may be implemented. For example, system 100 of FIGS. 1-2, as described above, may be implemented using system 400. In some embodiments, process 300 of FIG. 3, as described above, may be implemented using system 400. Processing system 400 can be a computer, phone, PDA, tablet, or any other type of electronic device. Such an electronic device includes various types of computer readable media and interfaces for various other types of computer readable media. As shown in FIG. 4, system 400 includes a controller 402, a memory 404, an input interface 406, an output interface 408, and a communications module 410.

Controller 402, according to various embodiments, includes one or more of a processor, a microprocessor, a central processing unit (CPU), a graphics processing unit (GPU), a single-core processor, a multi-core processor, a microcontroller, a programmable logic device (PLD) (e.g., field programmable gate array (FPGA)), an application specific integrated circuit (ASIC), a digital signal processing (DSP) device, or other logic device that may be configured, by hardwiring, executing software instructions, or a combination of both, to perform various operations discussed herein for embodiments of the disclosure. Controller 402 may be configured to interface and communicate with the various other components of the processing system 400 to perform such operations. For example, controller 402 may be configured to receive and process magnetic flux data received from the one or more position sensors (e.g., the first position sensor, the second position sensor, and the third position sensor), store the magnetic flux data in memory 404, and/or retrieve stored magnetic flux data from memory 404.

Controller 402 may include combinations of hardware and software processing functionality and may be provided with/in and/or communicatively coupled to other components to execute appropriate instructions, such as software instructions and/or processing parameters stored in memory 404. In various embodiments, controller 402 may be configured to execute software instructions stored in memory 404 to perform various methods, processes, or operations in the manner described herein.

Memory 404 includes, in one embodiment, one or more memory devices configured to store data and information, including magnetic flux data and position information. Memory 404 may include one or more various types of memory devices including volatile and non-volatile memory devices, such as random access memory (RAM), dynamic RAM (DRAM), static RAM (SRAM), non-volatile random-access memory (NVRAM), read-only memory (ROM), programmable read-only memory (PROM), erasable programmable read-only memory (EPROM), electrically-erasable programmable read-only memory (EEPROM), flash memory, hard disk drive, and/or other types of memory. As discussed above, controller 402 may be configured to execute software instructions stored in memory 404 to perform method and process steps and/or operations. Controller 402 may be configured to store in memory 404 magnetic flux data and position information.

Input interface 406 includes, in one embodiment, a user input and/or an interface device, such as one or more knobs, buttons, slide bars, keyboards, and/or other devices, that are adapted to generate a user input control signal. Controller 402 may be configured to sense control input signals from a user via input interface 406 and respond to any sensed control input signals received therefrom. Controller 402 may be configured to interpret such a control input signal as a value, as generally understood by one skilled in the art. In one embodiment, input interface 406 may include a control unit (e.g., a wired or wireless handheld control unit) having push buttons adapted to interface with a user and receive user input control values. In one implementation, the push buttons of the control unit may be used to control various system functions.

Output interface 408 may enable, for example, the output of data or other information. Output interface 408 may include, for example, one or more display devices, such as monitors or other visual displays (e.g., light emitting diode (LED) displays, liquid crystal displays (LCDs), or other types of displays). Some implementations include devices such as a touchscreen that function as both input and output components. Controller 402 may be configured to render data and information on output interface 408. For example, controller 402 may be configured to render magnetic flux and/or position data on output interface 408, such as magnetic flux and/or position data stored in memory 404.

In some embodiments, various components of system 400 may be distributed and in communication with one another over a network. In this regard, system 400 may include a communications module 410 configured to facilitate wired and/or wireless communication among various system components over the network. Such a network may include, for example, a local area network ("LAN"), such as an Intranet, or a wide area network ("WAN"), such as the Internet.

As shown, system 400 may include position sensor system 412. Position sensor system 412 may be similar to system 100 of FIGS. 1-2, described above. For example, position sensor system 412 may include one or more position sensors configured to sense, acquire, monitor, or otherwise determine a position of one or more magnetic targets, such as one or more magnets coupled to a target object.

In some embodiments, various components of system 400 may be communicatively connected via a system communications bus 414. Bus 414 collectively represents all system, peripheral, and chipset buses that communicatively connect the numerous devices of system 400. For instance, bus 414 may communicatively connect controller 402, memory 404, input interface 406, and output interface 408 together.

Where applicable, various embodiments provided by the present disclosure can be implemented using hardware, software, or combinations of hardware and software. Also, where applicable, the various hardware components and/or software components set forth herein can be combined into composite components comprising software, hardware, and/or both without departing from the spirit of the present disclosure. Where applicable, the various hardware components and/or software components set forth herein can be separated into sub-components comprising software, hardware, or both without departing from the spirit of the present disclosure. In addition, where applicable, it is contemplated that software components can be implemented as hardware components, and vice-versa.

Software in accordance with the present disclosure, such as non-transitory instructions, program code, and/or data, can be stored on one or more non-transitory machine-readable mediums. It is also contemplated that software identified herein can be implemented using one or more general purpose or specific purpose computers and/or computer systems, networked and/or otherwise. Where applicable, the ordering of various steps described herein can be changed, combined into composite steps, and/or separated into sub-steps to provide features described herein.

Embodiments described above illustrate but do not limit the invention. It should also be understood that numerous modifications and variations are possible in accordance with the principles of the invention. Accordingly, the scope of the invention is defined only by the following claims.

What is claimed is:

1. A system comprising:
a magnetic target coupled to and/or integrated with a target object;
a position sensor comprising a circuit board and a plurality of magnetometers disposed along the circuit board in a coplanar and noncolinear fashion, the plurality of magnetometers configured to provide a set of magnetic flux values corresponding to a magnetic field generated by the magnetic target; and
a logic device configured to communicate with the position sensor, wherein the logic device is configured to:
receive the set of magnetic flux values provided by the plurality of magnetometers of the position sensor; and
determine a position and/or orientation of the target object based, at least in part, on the received set of magnetic flux values.

2. The system of claim 1, wherein the plurality of magnetometers comprises:
first, second, and third magnetometers configured to detect respective first, second, and third magnetic flux values corresponding to the magnetic field generated by the magnetic target.

3. The system of claim 1, wherein:
the logic device is physically coupled to the circuit board of the position sensor.

4. The system of claim 1, further comprising:
a second magnetic target coupled to and/or integrated with the target object; and
a second position sensor comprising a second plurality of magnetometers configured to provide a second set of magnetic flux values corresponding to a second magnetic field generated by the second magnetic target, wherein the logic device is configured to:
receive the second set of magnetic flux values provided by the second plurality of magnetometers of the second position sensor; and
determine the position and/or orientation of the target object based, at least in part, on the received set of magnetic flux values and the received second set of magnetic flux values.

5. The system of claim 4, further comprising:
a third magnetic target coupled to and/or integrated with the target object; and
a third position sensor comprising a third plurality of magnetometers configured to provide a third set of magnetic flux values corresponding to a third magnetic field generated by the third magnetic target, wherein the logic device is configured to:
receive the third set of magnetic flux values provided by the third plurality of magnetometers of the third position sensor; and
determine the position and/or orientation of the target object based, at least in part, on the received set of magnetic flux values, the received second set of magnetic flux values, and the received third set of magnetic flux values.

6. The system of claim 1, wherein:
the target object comprises a gimbal configured to adjust a position and/or orientation of a payload coupled to the gimbal; and
the magnetic target is coupled to and/or integrated with the gimbal.

7. The system of claim 1, wherein:
the target object comprises a payload coupled to a gimbal configured to adjust a position and/or orientation of the payload; and
the position sensor is coupled to the gimbal.

8. The system of claim 1, wherein:
the target object comprises an articulated payload coupled to a mobile structure; and
the position sensor is coupled to the mobile structure.

9. The system of claim 1, wherein the logic device is configured to:
receive an updated set off magnetic flux values provided by the plurality of magnetometers of the position sensor; and
determine an updated position and/or orientation of the target object based, at least in part, on the received updated set of magnetic flux values.

10. A position sensor comprising:
a plurality of magnetometers configured to provide a set of magnetic flux values corresponding to a magnetic field generated by a magnetic target physically separated from the position sensor, wherein the plurality of magnetometers comprises first, second, and third magnetometers configured to detect respective first, second, and third magnetic flux values corresponding to the magnetic field generated by the magnetic target, and wherein the first, second, and third magnetometers are configured to measure a displacement of the magnetic target from the position sensor; and
a circuit board, wherein the plurality of magnetometers are disposed along the circuit board in a coplanar and noncolinear fashion.

11. The position sensor of claim 10, wherein:
the first magnetometer is configured to detect the first magnetic flux value along a first axis of the position sensor;
the second magnetometer is configured to detect the second magnetic flux value along a second axis of the position sensor;
the third magnetometer is configured to detect the third magnetic flux value along a third axis of the position sensor; and
the first, second, and third magnetometers are parallel to each other.

12. A method comprising:
receiving magnetometer data from one or more position sensors, wherein the magnetometer data comprises magnetic flux values provided by first, second, and third magnetometers of the one or more position sensors, the magnetic flux values corresponding to a magnetic field generated by one or more magnetic targets coupled to and/or integrated with a target object and physically separated from the respective one or more position sensors, the first, second, and third magnetometers configured to measure a displacement of the one or more magnetic targets from the one or more position sensors; and determining a position and/or orientation of each of the one or more magnetic targets and/or the target object based, at least in part, on the received magnetometer data.

13. The method of claim 12, wherein:
the determining the position and/or orientation of each of the one or more magnetic targets and/or the target object comprises determining an angular orientation of the target object based on the received magnetometer data.

14. The method of claim 12, further comprising:
receiving updated magnetometer data from the one or more position sensors; and
determining an updated position and/or orientation of each of the one or more magnetic targets and/or the target object based, at least in part, on the received updated magnetometer data.

15. The method of claim 14, wherein the determining the updated position and/or orientation of the target object comprises determining a linear displacement and/or an angular displacement of the target object.

16. The method of claim 12, wherein:
the first magnetometer is configured to detect the first magnetic flux value along a first axis of the position sensor, the second magnetometer is configured to detect the second magnetic flux value along a second axis of the position sensor, and the third magnetometer is configured to detect the third magnetic flux value along a third axis of the position sensor; and
the first, second, and third axes are parallel to each other.

17. The method of claim 12, wherein:
the target object comprises an articulated payload coupled to a mobile structure; and
the position sensor is coupled to the mobile structure or to a gimbal coupled to the mobile structure and is configured to adjust a position and/or orientation of the articulated payload.

18. The method of claim 12, wherein the target object comprises a payload coupled to an actuated mount configured to adjust a position and/or orientation of the payload, the further comprising calibrating the magnetometer data provided by the one or more position sensors by:
controlling the actuated mount to position and/or orient the payload according to a set of known positions and/or orientations of the one or more magnetic targets and/or the target object;
receiving a set of magnetometer calibration data from the one or more position sensors corresponding to the set of known positions and/or orientations; and
generating a database comprising the set of known positions and/or orientations referenced to the set of magnetometer calibration data.

19. The method of claim 12, wherein the first, second, and third magnetometers are disposed along a circuit board in a coplanar and noncolinear fashion.

20. The position sensor of claim 10, wherein the position sensor includes a maximum of three magnetometers corresponding to the first, second, and third magnetometers.

* * * * *